United States Patent [19]
Detig et al.

[11] Patent Number: 5,817,374
[45] Date of Patent: Oct. 6, 1998

[54] PROCESS FOR PATTERNING POWDERS INTO THICK LAYERS

[75] Inventors: Robert H. Detig, Berkeley Heights, N.J.; William A. Hendrickson, Houlton, Wis.

[73] Assignee: Electrox Corporation, Newark, N.J.

[21] Appl. No.: 656,089

[22] Filed: May 31, 1996

[51] Int. Cl.$^6$ ................................ B05D 1/06; B05D 1/32
[52] U.S. Cl. ..................... 427/466; 427/468; 427/472; 427/474; 427/282
[58] Field of Search ..................... 427/466, 468, 427/469, 472, 474, 475, 532, 533, 282

[56] References Cited

U.S. PATENT DOCUMENTS

| | | | |
|---|---|---|---|
| 2,876,086 | 3/1959 | Raymond | 51/298 |
| 3,238,053 | 3/1966 | Morgan | 427/468 |
| 3,839,027 | 10/1974 | Pressman | 96/1 R |
| 3,848,363 | 11/1974 | Lovness et al. | 51/7 |
| 3,888,207 | 6/1975 | Stutz et al. | 118/621 |
| 3,892,908 | 7/1975 | Lovness | 428/329 |
| 4,024,295 | 5/1977 | Chase et al. | 427/47 |
| 4,031,269 | 6/1977 | Takahashi | 427/466 |
| 4,086,872 | 5/1978 | Pan | 118/630 |
| 4,780,331 | 10/1988 | Cobbs, Jr. et al. | 427/474 |

FOREIGN PATENT DOCUMENTS

| | | |
|---|---|---|
| 760526 | 10/1956 | United Kingdom . |
| 2220871 | 1/1990 | United Kingdom . |

OTHER PUBLICATIONS

M. A. Hossain, et al., "Effect of Temperature, Particle Average Diameter and Bed Height on Minimum Fluidizing Velocity", *Particulate and Multiphase Processes*, (edited by T. Ariman and T. Veziroglu), Springer–Verlag, 633–644, (1987).

*Primary Examiner*—Shrive Beck
*Assistant Examiner*—Fred J. Parker
*Attorney, Agent, or Firm*—Schwegman, Luundberg, Woessner & Kluth, P.A.

[57] ABSTRACT

Particles are applied to the surfaces of materials, especially in the form of discontinuous or patterned coatings on the surfaces of sheet materials by a process comprising the steps of:

a) providing a support, b) placing a bed of non-adhered particles on the support, the particles being capable of being moved by an electric field of less than 100 KV/cm, c) placing a mask with a first and second surface over the bed of non-adhered particles, the mask having holes which pass from the first to the second surface, the first surface facing the bed of non-adhered particles without the mask touching the bed of non-adhered particles, the holes in the mask having a size which would allow passage of individual particles from the bed of non-adhered particles through the holes, d) placing a receptor material capable of at least temporarily retaining an electric charge adjacent to the second surface of the mask, which second surface faces away from the bed of non-adhered particles, e) applying an electrical charge to the receptor material which is at least temporarily retained by the receptor material, f) applying an electrical field between the mask and the support, the electrical field being of at least sufficient strength to cause individual particles from the bed of non-adhered particles to move off the first substrate and impact the mask, g) allowing some of the individual particles which move off of the support to enter the holes in the mask and contact the receptor material, and h) the contract by individual particles to the receptor material causing at least some of the particles contacting the receptor material to adhere to the receptor material at least by charge attraction of the individual particles to charge on the receptor material.

28 Claims, 5 Drawing Sheets

PROCESS FOR PATTERNING POWDERS INTO THICK LAYERS

BACKGROUND OF THE INVENTION

1. Field of the Invention

The present invention relates to a process for producing patterned articles by deposition of particles onto a receptor surface, and the articles made thereby. The present invention more particularly relates to the deposition of dry particles onto surfaces to make patterns of deposited particles of controllable thickness on the surface of a receptor.

2. Background of the Art

Silk screen printing is one of the oldest graphic arts technologies (besides manual deposition of pigments or dyes to a surface) still in commercial use. The process was believed to have been originated by the ancient Chinese, using silk screens to deposit colorant fluids (e.g., inks) through the screen onto a surface. The technology is still used commercially today, not only for imaging, but also for manufacture of detailed patterns for circuitry, conductors, adhesives and the like. Window defrosters and antennae on car windows are sometimes still made by the process.

Few dry powder screening processes have been known to provide sufficient benefits to succeed commercially. It is believed that early Chinese artists may have manually brushed dry powder through the silk screens onto various surfaces to which the powders would adhere.

U.S. Pat. No. 4,698,907 teaches processes for the application of patterns of dry metallic powders. The processes use electrophotography, electrically charged drums, latent charge images (e.g., electrography), or dielectric webs, with metal powders applied as toners from brushes or cascade development applicator systems. It is disclosed that the metal powder is to be coated with a thin dielectric layer so that it may be electrically charged and transferred.

U.S. Pat. No. 3,166,432 teaches that electrically conducting toner particles may be applied by induction development. Indeed, many commercial copying or imaging systems use dry toner powders (usually defined as having less than 10% by weight volatile materials in fresh materials) as the toning agents. These toners often comprise a blend or other physical association of colorant (e.g., pigment or dye), binder, and charge control agent. These particles tend to be very thin layers of particles (even monolayers in may cases) when they are applied, described in Schein, *Electrophotography and Development Physics*, Springer Vertag, Berlin 1988, P. 180. The application of multiple layers or thick layers of toner materials may require the use of special receptor surfaces with coatings that are receptive to larger volumes of materials (e.g., U.S. Pat. No. 4,337,303, Sahyun et al.).

U.S. Pat. No. 3,081,698 described an electrostatic stencil screen printing process. Contact free printing was performed on delicate or rough surfaces by moving a dry resinous material through the openings of a stencil mask by electrostatic forces. In all cases, the toner used was a dry resinous material that could be triboelectrically charged, and a powder cloud of the material was mechanically created. In FIG. 5, the particles are apparently being suspended by air movement. The charged toner particles were projected through the mask or stencil at a relatively distant target/receptor (e.g., paper being separated from the stencil by an air gap). Technical review of the commercial efforts on this technology (*Electrophotography*, R. M. Shaffart, 1975, p. 211) emphasized the use of rotating brushes to apply the powder and rough or odd shaped articles to be printed upon.

The movement of conducting particles between electrodes has already been studied in the literature (*Electrostatics, Principles, Problems and Applications*, J. A. Cross, Adam Hilger, Bristol, 1987, pp.293–295 and 302–307), including the creation of fluidized beds. The processes considered include fingerprinting and fiber spinning and formation.

BRIEF DESCRIPTION OF THE INVENTION

The present invention describes a process for depositing layer(s) of particles onto a dielectric material by electro static propulsion or transport of the particles from an electrostatic cloud of particles through a screen, mask or stencil. The dielectric material is placed over or adjacent to one of the two surfaces of the screen, a bed of electrically conductive particles is placed under or adjacent to the second of said two surfaces of said screen, and an electric field is created between the screen and the particle bed. The dielectric surface is charged by any convenient means, (e.g., corona treatment, stylus application, field generation, etc.) and particles from the bed of particles move through the field between the screen and the bed of particles and are transported through the openings in the screen and deposited on the electrically charged dielectric surface. The physical distance of separation between the dielectric material and the first surface of the screen is very small (e.g., less than 10 microns, preferably less than 5 microns, and within a range usually with the dielectric in contact with the back of the screen (away from the particle bed) or with a less preferable distance between the dielectric and the screen of between 0.01 and 10 microns, more preferably between 0.05 and 5 microns. This small or preferably non-existent physical distance enables higher resolution of particle deposition and desirable buildup of particulates within chambers forming the openings in the screens to create thick deposition of particles.

DETAILED DESCRIPTION OF THE INVENTION

Figure 1:
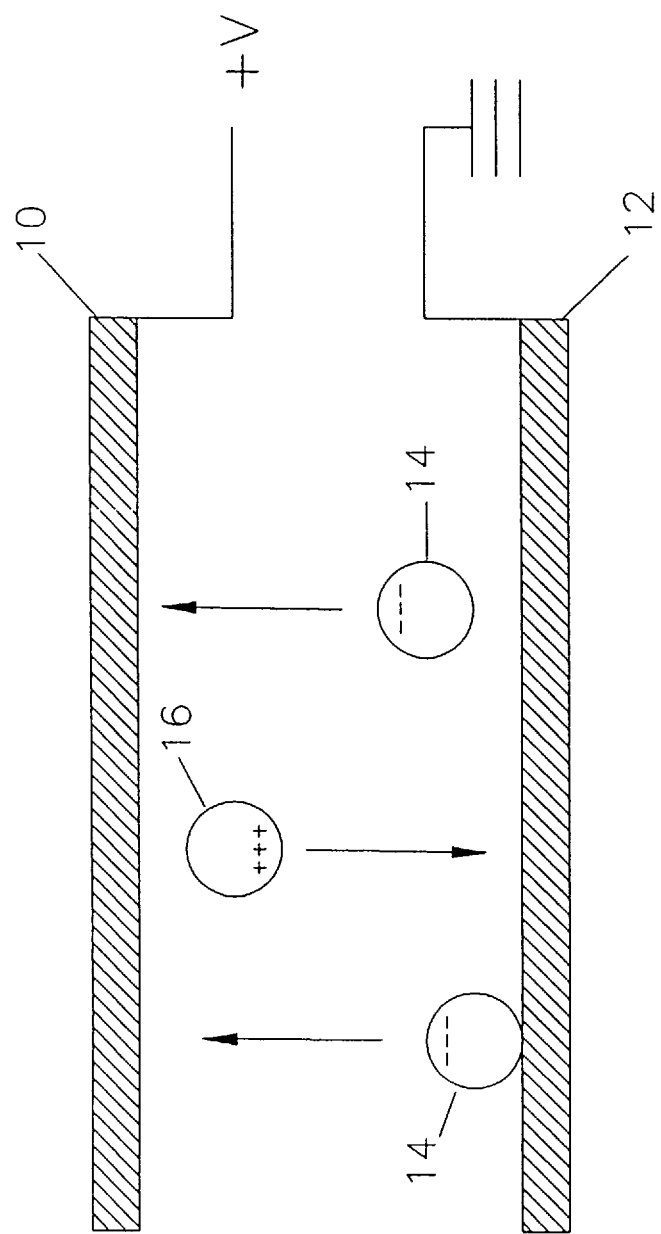
FIG. 1 shows the basic process of the invention in operation.

There are at least three essential elements within the practice of the present invention, a bed of particles, a mask (stencil or screen) and dielectric receptor. The particles may be any particles capable of being moved by electrostatic (electric charges) through a field. It is generally preferred that the particles be relatively small, and/or electrically conductive particles. Preferably the particles have dimensions equal to or less than 5 millimeters and greater than 5 micrometers, more preferably between 10 micrometers and 4 mm, and most preferably between 15 micrometers and 2 or 3 millimeters. Depending upon the desired materials to be deposited and the types of technology being practiced, however, the size of the particles (except relative to the size of the opening in the mask) is not a critical limitation on the practice of the present invention. It is desirable that the particles be electrically conductive, but this does not mean that the particles must be homogeneous in composition or properties. It is in fact an advantage of the present invention that materials which can not be ordinarily deposited or applied easily can be pretreated (as with a conductive polymer, metal, organic or inorganic coating) to provide a permanent or temporary conductive property and the then treated particle readily can be used in the process of the present invention. The particles do not even have to be conductive in the common sense of the term as long as they are capable of being moved by electrical charges or electrical fields. Materials that have the ability to temporarily retain charges or have an internal distribution of charges may be used in the practice of the present invention, even if they are not highly conductive.

The process of the present invention may be generally described as a process for applying a discontinuous coating of particulates to a surface comprising the steps of:

a) providing a first substrate, b) placing a bed of non-adhered particles on said substrate, said particles being capable of being moved by an electric field of less than 100 KV/cm, c) placing a mask with a first and second surface over said bed of non-adhered particles, said mask having holes which pass between the first and second surfaces, said first surface facing said bed of non-adhered particles without said mask touching said bed of non-adhered particles, said holes in said mask having a size which would allow passage of individual particles from said bed of non-adhered particles through said holes, d) placing a receptor material capable of at least temporarily retaining an electric charge adjacent said second surface of said mask, which second surface faces away from said bed of non-adhered particles, e) applying an electrical charge to said receptor material which is at least temporarily retained by said receptor material, f) applying an electrical field between said mask and said first substrate, said electrical field being of at least sufficient strength to cause individual particles from said bed of non-adhered particles to move off said first substrate and impact said mask, g) allowing some of said individual particles which move of said first substrate to enter said holes in said mask and contact said receptor material, and h) said contact by individual particles to said receptor material causing at least some of said particles contacting said receptor material to adhere to said receptor material at least by charge attraction of said individual particles to charge on said receptor material. It is preferred that the substrate supporting the particles, the mask and the dielectric are approximately parallel to each other and to the ground (e.g., at within ±5 degrees of parallelity, more preferably within ±2.5 degrees of parallelity) to provide more even distribution of particles within the electrostatic cloud, which in turn provided a more even distribution of particles to the holes.

This process of the invention allows particles passing through the holes in said mask to form patterns of particles of at least three particle diameters in thickness, and preferably the thickness of individual segments of said pattern of particles have thicknesses of at least five diameters of particles. The process of the invention easily allows for the individual particles to have an average diameter of between 5 micrometers and 5 millimeters. The particles may have an electrical resistivity of less than $10^{+10}$ or less than $10^{+11}$ ohm-centimeters. Although any particles which can be moved by the applied field may be used in the practice of the present invention, it is preferred that particles are selected from the class consisting of metals, metal alloys, glass, ceramics, inorganic compounds, and organic materials. Organic materials include polymeric materials as well as simple compounds. Preferred receptor material comprises organic polymeric film, ceramics, uncoated papers, or composite materials. The process of the invention is highly useful where said particles comprise a core of relatively low conductivity material and a shell of relatively greater conductivity than said core.

Amongst the types of materials which are most desirably used in the practice of the present invention are solid powders, including such materials as magnetic compositions (metals, metal oxides, or combinations thereof, with or without binders), abrasive particles (e.g., metal oxides, non-metallic oxides, blends and mixtures thereof, with or without binders), semiconductive materials, luminescent materials (phosphorescent and luminescent materials, CRT phosphors), imaging materials (toners, receptive compositions for toners or thermally transferable compositions, decorations for surfaces in hard to apply finishes, as in metals applied to wood), conductive materials (metals, metal oxides, conductive polymers and the like for producing circuitry), circuitry subbing layers (e.g., polyimide patterns, mask patterns for subsequent electroless deposition, and the like), and any other particulate material which is desirably applied in a pattern or precise amount onto a surface.

The screen may be composed of any material which can be used in an electrostatic or electrical transfer process. It is preferred that the screen be electrically conductive to reduce static buildup in the screen from the transfer of charges to the screen from particles which contact the screen while moving through openings or when being deposited on the dielectric layer. However, it is possible to ground the screen or have a layer attached thereto which bleeds charge away from the screen, without the screen itself being conductive. The use of a screen comprising sufficient conductive material to conduct charge away from the particles is preferred. The screen may be made of such materials as metal, metal coated polymer, metal coated composite, conductive composite, conductive polymers, and the like. Preferably the screen is essentially parallel to the bottom support layer for the bed of particles.

The dielectric surface may be any material which is capable of retaining a charge of sufficient intensity and sufficient duration to allow it to be used in the process of the present invention. Polymeric materials and composite materials are especially useful substrates for use in the practice of the present invention, but other materials which may not be dielectric may have dielectric coatings applied thereto so that they can be used in the practice of the present invention. Preferred polymers for use in the practice of the present invention include polyesters (e.g., polyethyleneterephthalate and polyethylenenaphthalate), polyamides, polyolefins, polycarbonates, polyimides. Polyvinyl resins (e.g., polyvinyl chloride, polyvinylacetals, polyvinylidene chloride, polyvinyl acetates, etc.), cellulose esters, fluorinated polymers ), polytetrafluoroethylene, Kevlar™, etc.), polysiloxanes, epoxy resins, and the like.

Other materials which can act as a dielectric, as known in the art, may also be used, such as composite materials, ceramics, glasses, paper, and the like. The dielectric is ordinarily placed in physical contact with the screen, this configuration preventing particulates from moving outside the defined area of the holes and thereby retaining resolution approximating the physical dimensions of the holes in the screen themselves. However, there are circumstances in which the dielectric may be advantageously moved small dimensions away from actual contact with the screen. For example, where increased adhesion between the individually built up particle collections within the holes in the screen and the dielectric, it can be desirable to have the particles form a floor underneath the raised areas of the multiple layers of patterns. By controlling the distance of separation between the screen and the dielectric (e.g., to slightly more than multiples of particles diameters), the distance away from the edges of the holes which particles may migrate to can be readily controlled. This could provide monolayer or multiple layer edges around the core of the particle patterns that can help to secure the higher patterns of particles to the substrate by increasing the surface area of contact between the individually raised particle collections, without destroying the effective pattern of heights of particles within the pattern. For example, where the pattern formed is a pattern of abrasive, as long as the height of the individual collections of particles sufficiently differentiates from the floor created by the gap between the layers, the wider distribution of the particles as compared to the exact dimensions of the holes can be desirable.

Amongst the advantages of the practice of the present invention are:

1) Conductive particles may be directly applied to dielectric surface without surface coatings on the particles. This allows for coatings of metals such as gold, silver, aluminum, copper, chrome, and the like without coatings that would interfere with or detract from the desired properties of the pure material.
2) The particles can be accelerated at a high rate in the process, which can be used to assist in firm attachment of the particles to the dielectric surface and can aid in increasing the resolution of the deposition by reducing the influence of other forces upon the direction of the particles.
3) Uniform layers of particles can be deposited or built up layers of reasonably similar thickness can be built up within each of the openings in the screen.
4) Thick layers, containing many layers of particles can be generated.
5) The particles, even though they may be electrically conductive, retain a charge throughout the process. This can serve to hold the particles in place for further treatment after their patterned deposition.
6) Particles are uniformly distributed within the electrostatic cloud, which promotes better and more even application of particles to the holes as compared to mechanically supported clouds which tend to have more uneven distributions because of air currents and channels in the mechanical patterns of support.
7) The clouds can be quite dense (i.e., have a large number of moving particles per volume between the mask and the support plate, which enables a high rate of deposition in the process. Rates of 0.1 m/sec. to 3 m/sec. can be readily achieved with multiple layer depositions of particulates, and higher rates are possible.
8) Unusually shaped particles, including assicular particles (long, thin particles) can be deposited with this process with high efficiency, as the particles orient preferentially along field lines.

In the practice of the present invention, conductive particles form a particle cloud between two charged plates. As shown in FIG. 1, one plate 10 may, for example, be positively charged, thereby attracting negatively charged particles 14. The positively charged particles 16 would be repelled form positively charged plate 10 and moved towards a grounded plate 12. This plate 12 is grounded rather than strongly negatively charged in this FIG. 1 for illustrative purposes only. The electric potential between the plates 10 and 12 has been raised to a sufficient level so that the surface electrostatic forces of the particles (the same forces which tend to collapse the field on the plates of a capacitor) exceed the force of gravity (when the plates are parallel to the ground or perpendicular to the force of gravity) and van der Waals charge on the particles. When the negatively charged particles 14 reach the top plate, they discharge rapidly, recharge in the opposite manner, becoming positively charged particles 16 that are repelled by the positively charged plate 10 and move quickly towards the ground plate 12. If the plates are parallel, a relatively dense and stable cloud of particles can be readily achieved, with particles having different charges moving in different directions within the cloud. Negatively charged particles 14 move upwardly and positively charged particles 16 move downwardly.

Figure 2:
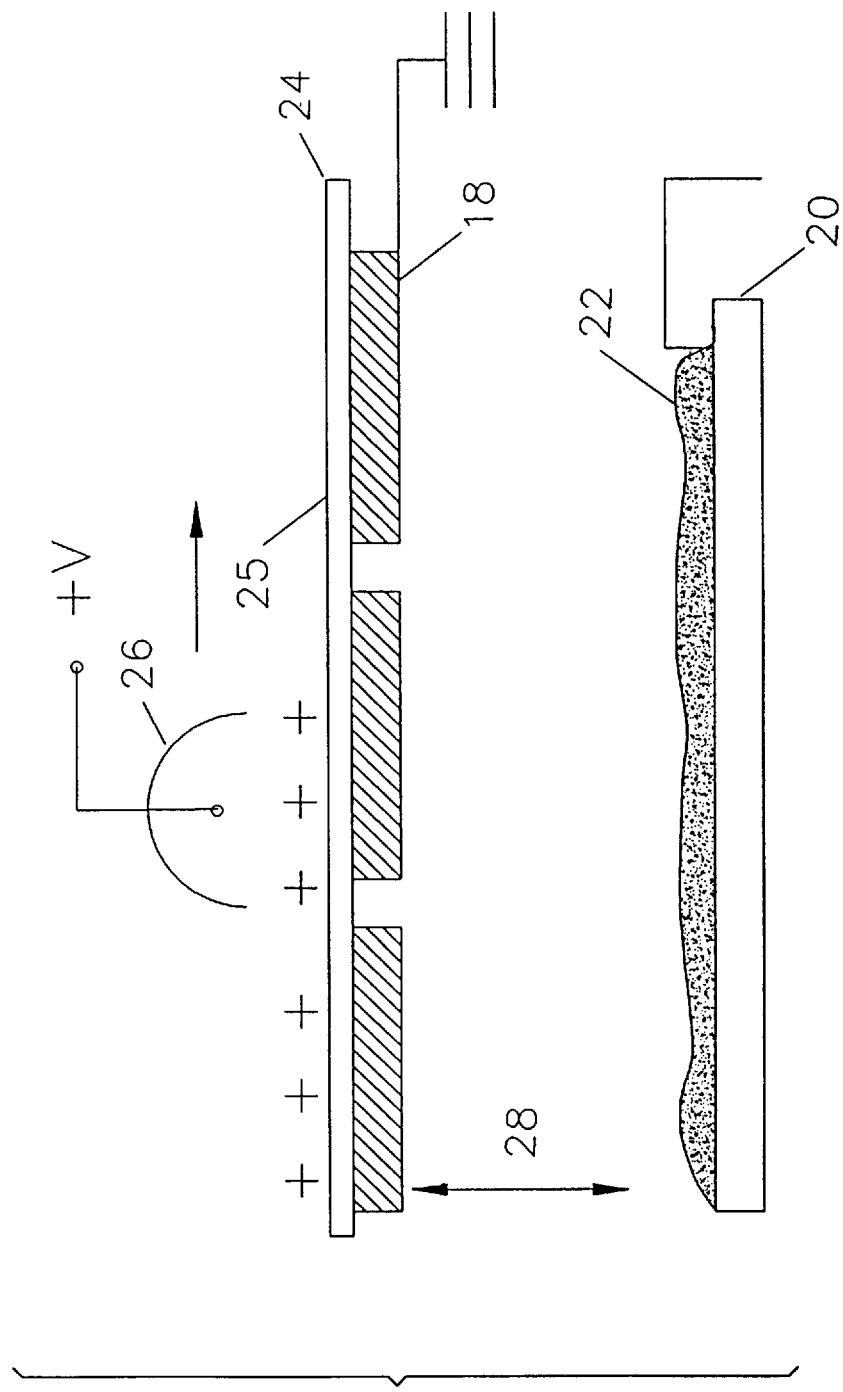
FIG. 2 shows a more detailed configuration of the process of the invention in operation.

FIG. 2 shows a more detailed representation of the first steps in the process of the present invention. A dielectric layer 24 is placed on the back of a mask layer 18. The dielectric layer 24 is shown in actual contact with the back of the mask layer 18, this is highly preferred, but not required. Spacing may be created between the dielectric layer 24 and the mask layer 18 which can provide desirable benefits in special circumstances. Separated from mask 18 by a distance 28 is a bottom plate 20 carrying a bed of conductive particles 22. A moving corona generator 26 applies a positive charges to the backside 25 of the dielectric layer 24. Typically, the corona discharge unit will mechanically scan the backside of the dielectric layer 25, charging it positively to +1200 volts across a, for example, a 50 micrometer thick layer (e.g., of polyethyleneterephthalate dielectric 24).

Figure 3:
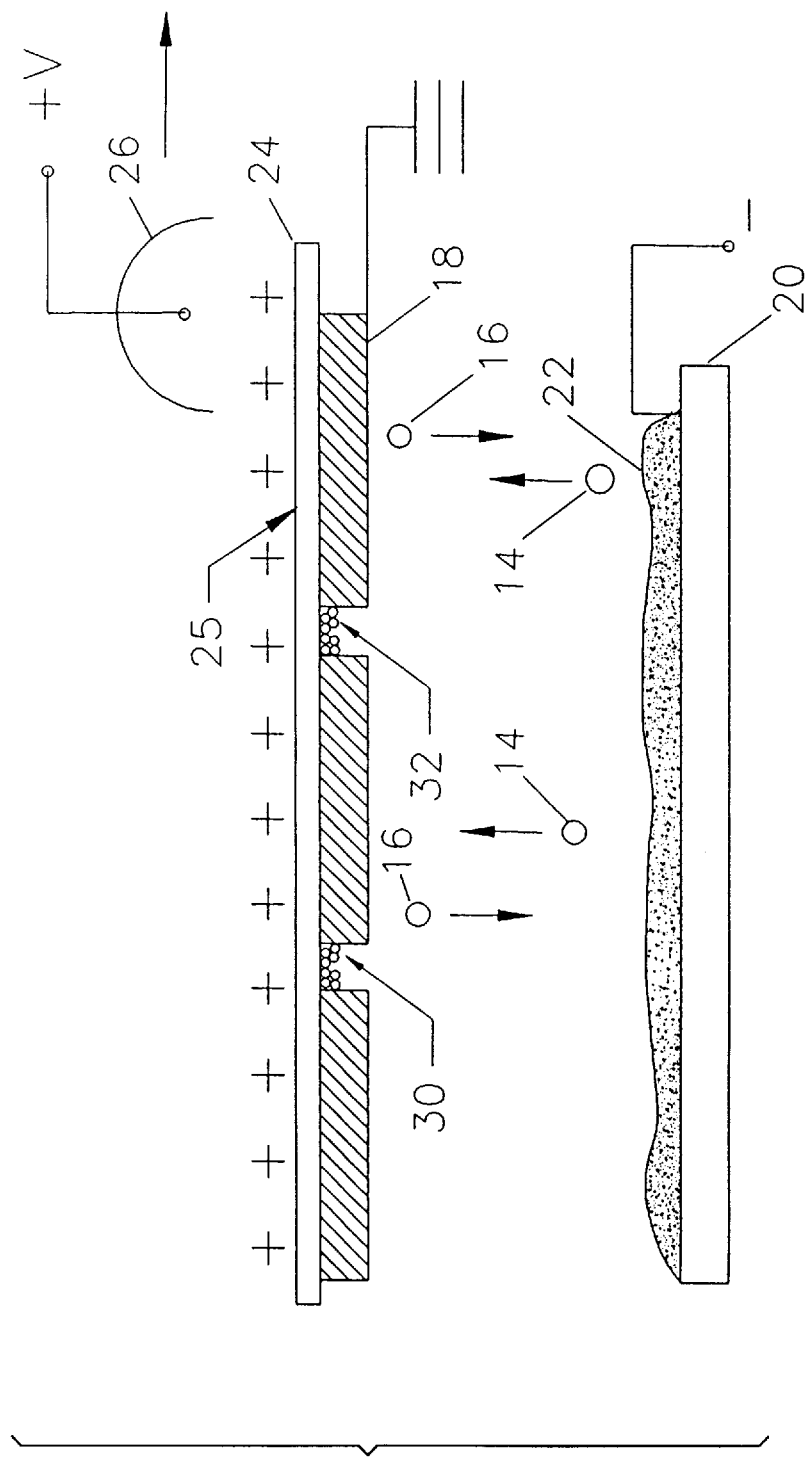
FIG. 3 shows physical effects of the process of the invention during its operation.
Figure 4:
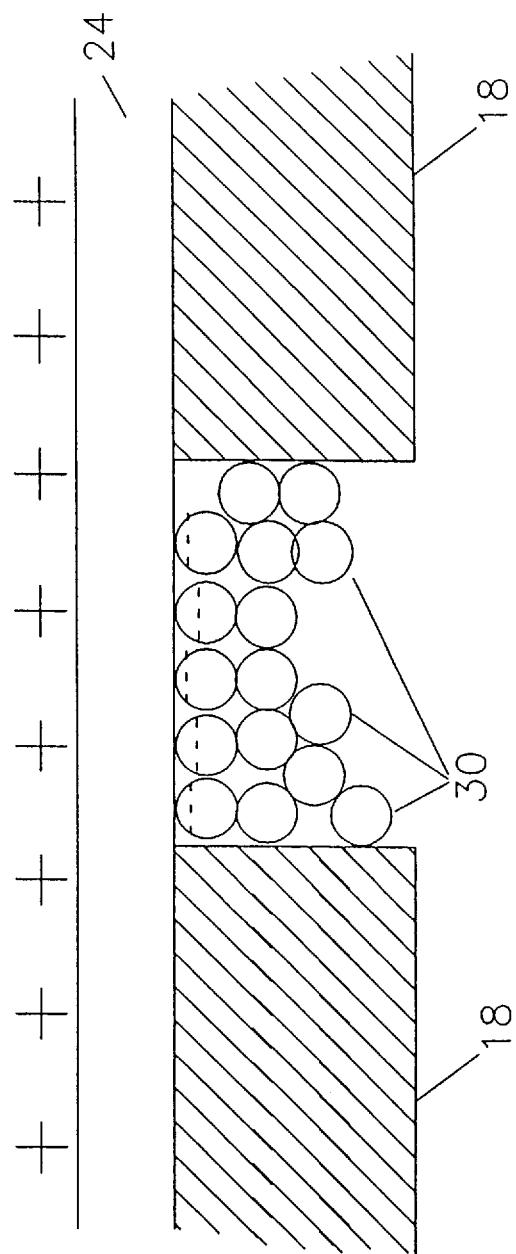
FIG. 4 shows details of particulate 30 deposition within openings of screens in the practice of the invention.

In FIG. 3, after the corona charging unit 26 has finished its pass over the back surface 25 of the dielectric layer 24, the voltage to the corona discharge unit 26 is discontinued. The charge remains on the dielectric layer 24 for a period of time as the charge leaks away from the layer slowly. The bottom plate 20 has its electric potential dropped to a negative charge (by any convenient means, not shown) of sufficient intensity to generate the particle cloud. Particles (not shown) which hit the mask 18 have their charge discharged and reversed, and then continue to fly back and forth between the plate 20 and the mask 18. Those particles 30 which land in the holes 32 in the mask 18 do not discharge, but are held in place against the surface of the dielectric layer 24. The particles 30 are held in place by electrostatic charges from the backside 25 of the dielectric layer 24. Upper layers (not specifically identified) of particles 30 typically do discharge to the particles 30 within the hole 32 and closer to the dielectric layer 24. The thickness of the layer formed by the deposited particles 30 continues to build up, until such time as forces may occur within the system which limit the growth of the thickness of the deposited layer. This could be caused by gravity, field influences from the lower plate 20, or other factors. The final thickness of a layer formed from deposited particles 30 (as shown in FIG. 4) will usually be a fraction of the depth of the hole 32 into which the particles 30 are attracted. That fraction, however, may approach or even reach 100% of that depth under ideal circumstances. The actual fraction, and the measure of the thickness of deposition during practice of the process of the invention, may have to be determined by observation rather than specific outside control or measurements. The rate of deposition will depend upon many variables, including the mass of the particles, distribution of size and mass of the particles, strength and variability of the electrical and forces, properties of the dielectric layer and the screen layer, and the like. The surface of the layer or individual particles deposited within each hole of the screen or mask may be concave, because of various interacting forces within the deposition process. This can act as a fingerprint for certain deposited patterns of materials according to the practice of the present invention, particularly for the thicker pattern depositions (e.g., greater than 5 micrometers or greater than 10 micrometers). During this deposition portion of the process, the walls of the holes 32 tend to shadow or shield the particles from the influences of the field generated from the lower plate 20.

Figure 5:
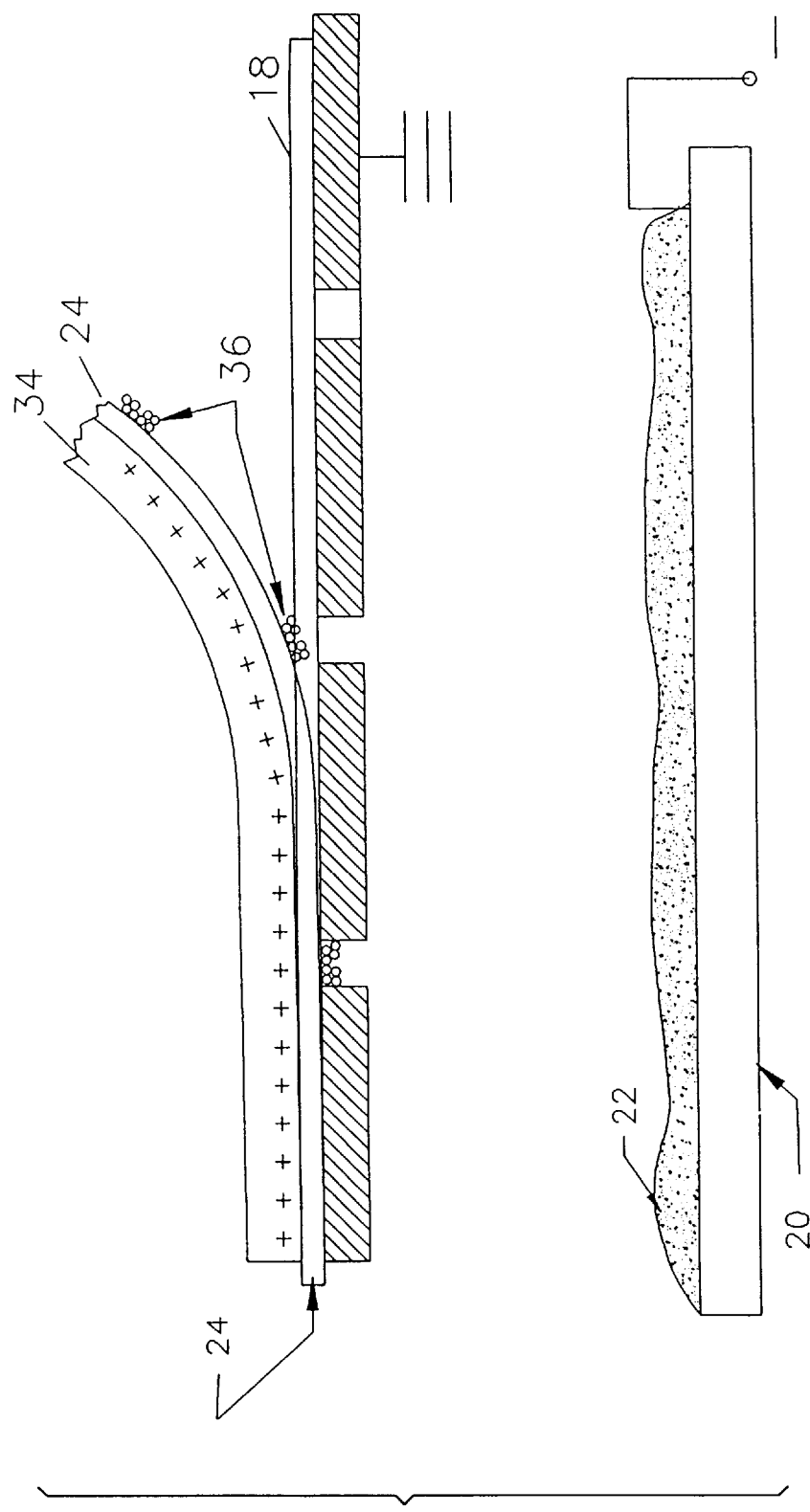
FIG. 5 shows a final step in the operation of the process of the present invention.

FIG. 5 shows a temporary pseudo ground plate 34 (e.g., made of metallized polyethyleneterephthalate, with the metallic layer [not shown] away from the pattern of particles 36) placed over dielectric layer 24 during removal of the dielectric layer 24 with the pattern 36 of deposited particles on its surface. The pseudo ground layer 36 stabilizes the charges on the dielectric layer 24 as it is being removed from the mask 18. If some control over electric forces were not present, very high voltage could build up during removal of the dielectric layer 24 and there could be an electrical breakdown in the system.

Capacitor plates 10 and 12 have a voltage (V) established between them as shown in FIG. 1. Conductive particles 14 on the bottom plate 20 or just leaving the bottom plate 20 have a negative charge induced on the particles 14 by the electric field between the two plates. Conductive particles of an otherwise identical composition 16 have a positive charge on their surface because they have left the top plate 10 after discharging there. All particles moving in an upward direction (towards the positively charged plate 10) have a negative charge, and all particles moving downward (away from the positively charged plate 10) have a positive charge.

In FIG. 2, the mask (or screen) 18 and the bottom plate 20 make up the equivalents of the capacitive plates 10 and 12 of FIG. 1. A bed of conductive particles 22 rests on the bottom plate 20. The object onto which a pattern of the particles in the particles bed 22 are to be deposited is dielectric layer 24. The back surface 25 of the dielectric layer 24 is charged by a corona charging unit 26. In this case a positive charge is chosen to be applied. After the charge is applied to the dielectric layer 24, an electric field is applied between the mask and the bottom plate 20 on which rests the particle bed 22. Particles 14 with a negative charge on their surfaces are moved from the bed 22 to strike the screen 18 or to enter holes 32 in the screen 18. An enlarged drawing of the deposited particles 30 within holes 32 is shown in FIG. 4.

A temporary ground plate 36 is placed over the back of the dielectric layer 24 with a pattern or particles 34 deposited thereon, as shown in FIG. 5. The dielectric layer 24, the pseudo ground layer 36 and the pattern of deposited particles 34 are stripped from the mask 24, the pseudo ground layer 36 preventing the generation of very high voltage which could cause electrical breakdowns in the system which could cause the particle pattern to be mechanically dispersed.

The particles may, if needed, be further treated, as by overcoating treatments or fusion treatments, or the like to permanently secure them to the dielectric layer. If the impact of the initial particles is sufficiently strong and the dielectric layer sufficiently soft or even tacky, the initial layer of particles may strongly adhere to the surface. The conductive particles, if polymeric in nature on their surface (e.g., with dispersed polymeric material therein or containing conductive polymeric units), may be secured to the dielectric by fusion or even induced (thermally or electromagnetically by light or radiation) to further polymerize (if a low molecular weight coating) or crosslink (if crosslinking agents or initiators are present).

These and other aspects of the present invention may become apparent through a review of the following non-limiting examples of the present invention.

EXAMPLES

Example 1

A bottom ground plate composed of copper clad glass-epoxy board is provided with a 2 mm layer of phosphor-copper powder (#1501, Zinc Corp. of America). A mask screen of 280 mesh/in. stainless steel photo polymer screen (the mesh screen has photopolymer applied thereto, the photopolymer is irradiated in a patterned distribution, then washed, removing the photopolymer in non-irradiated areas [negative acting system], and leaving hardened polymer in the interstices of the stainless steel screen in the pattern desired) made by Utz Engineering of Clifton, N.J. is placed over the ground plate, essentially parallel to the plate. The pattern provided in the screen is the USAF 1951 test chart. A dielectric layer of 2 mil (0.05 mm) thick polyethyleneterephthalate film (type 122 film, Minnesota Mining and Manufacturing Co., St. Paul, Minn.) is placed in contact with the side of the mask facing away from the particle bed on the ground plate. A corona discharge unit comprising a fiber brush of 12 micrometer diameter carbon fibers charged to +6.5 KV is moved over the back of the dielectric layer. The brushes in the corona discharge device are moved at a distance of between 1 and 2 cm from the back surface of the dielectric, covering a 10×10 cm film area in about 2 seconds. This sprays corona ions over the backside of the dielectric, charging it to about 1000 volts. During this time, the screen (mask) has been grounded. The corona unit was then stopped, and the bottom plate is driven to a negative potential of about −6.5 KV. The spacing between the bottom plate and the screen is approximately 1 cm. A cloud of the particles forms in the gap between the bottom plate and the mask, and particles collect in the holes in the screen against the dielectric layer. The particles are held in place by the attraction of the charge on the backside of the dielectric layer. The duration of the dwell time determines the depth of the hole which is filled with the particles, up to the limit of just below the top of the hole.

Good patterns to a resolution 4 cycles/mm, i.e., 4 line pairs/mm were produced by this process. After this imaging procedure, an aluminized polyethyleneterephthalate film (#100 MCZ, DuPont, Wilmington, Del.) was placed against the backside of the dielectric to be used as a temporary ground plate during lift off of the dielectric, with the aluminum side of the film facing away from the dielectric. The image remained intact after lift off.

Example 2

In the same apparatus used in Example 1, the phosphor-copper particles were replaced with glass microbeads made by Cataphote, Inc., Jackson, Miss., having a product number 4a, with a −120 to +170 mesh distribution of particles. These larger beads would not pass through the 280 mesh mask, which was then replaced with a 105 mesh silk screen from Utz Engineering. Essentially the same procedure as shown in Example 1 was repeated here, with a field of 6.5 KV was applied over a 6 mm gap between the mask screen and the bottom plate to provide a useful field of about 10 Kv/cm over the particle cloud produced. Good images were produced on the #122 polyester film. A smaller gap was used in this example because the particles used in the bed were larger.

Example 3

In the apparatus of Example 1, the receiving dielectric was replaced with printed news stock (the New York Times, Mar. 22, 1996). A piece of the imaged paper was cut out and dried for 30 seconds with a flat iron at about 200° F. (93°C.) surface temperature. Excellent metallic images were produced on the newspaper.

Example 4

The newspaper of Example 3 was replaced by a 4 in X×4 in. (10.2×10.2 cm) prima cotton flannel fabric and imaged and dried in the same manner as that Example. Excellent metallic images were produced on the fabric.

Example 5

In the apparatus of Example 1, the receiving dielectric was replaced with a thin layer of glass, 0.5 mm thick, in a panel 50×50 mm. (Corning Type 7059). Good imagewise deposition of the powder was achieved.

Example 6

In the apparatus of Example 1, the dielectric substrate was replaced with a 96 to 99% aluminum wafer, 1 mm thick, in a panel 100 mm×100 mm. This process created a hybrid circuit substrate with good resolution.

Example 7

In the apparatus of example 1, the bottom plate was covered with a 2 mm thick layer of silicon carbide powder (electrically conductive grade, Norton #180–5975, Norton Co., Wooster, Mass.).

Example 8

The procedure of Example 7 was repeated except that the dielectric layer was replaced with printed news stock. After coating with the silicon carbide powder, the imaged dielectric substrate was dried as in Example 3. The imaged material was bonded more securely by application of a lacquer spray coat (Plasti-Kote #349, Plasti-Kote Co., Medina, Ohio).

What we claim is:

1. A process for applying a discontinuous coating of particulates to a surface comprising the steps of:
   a) providing a support,
   b) placing a bed of non-adhered particles on said support, said particles being capable of being moved by an electric field of less than 100 KV/cm,
   c) placing a mask with a first and second surface over said bed of non-adhered particles, said mask having holes which pass from said first to said second surface, said first surface facing said bed of non-adhered particles without said mask touching said bed of non-adhered particles, said holes in said mask having a size which would allow passage of individual particles from said bed of non-adhered particles through said holes,
   d) placing a receptor material capable of at least temporarily retaining an electric charge in contact with said second surface of said mask, which second surface faces away from said bed of non-adhered particles,
   e) applying an electrical charge to said receptor material which is at least temporarily retained by said receptor material,
   f) applying an electrical field between said mask and said support, said electrical field being of at least sufficient strength to cause individual particles from said bed of non-adhered particles to move off said support and impact said mask,
   g) allowing some of said individual particles which move off said support to enter said holes in said mask and contact said receptor material, and
   h) said contact by individual particles to said receptor material causing at least some of said particles contacting said receptor material to adhere to said receptor material at least by charge attraction of said individual particles to charge on said receptor material.

2. The process of claim 1 wherein said receptor material is a dielectric material.

3. The process of claim 1 wherein said particles in said particles bed are electrically conductive particles.

4. The process of claim 2 wherein said particles in said particles bed are electrically conductive particles.

5. The process of claim 1 wherein said electrical field applied in step f) causes particles with an electrical charge opposite that of the charge provided on said receptor material to move towards said receptor material, and causes particles with an electrical charge similar to that of provided on said receptor material to move away from said receptor material.

6. The process of claim 5 wherein the movement of particles towards and away from said receptor material produces a cloud of moving particles between said first substrate and said mask.

7. The process of claim 1 wherein particles passing through said holes in said mask form patterns of particles of at least three particle diameters in thickness.

8. The process of claim 7 wherein the thickness of individual segments of said pattern of particles have thicknesses of at least five diameters of particles.

9. The process of claim 2 wherein particles passing through said holes in said mask form patterns of particles of at least three particle diameters in thickness.

10. The process of claim 9 wherein the thickness of individual segments of said pattern of particles have thicknesses of at least five diameters of particles.

11. The process of claim 3 wherein particles passing through said holes in said mask form patterns of particles of at least three particle diameters in thickness.

12. The process of claim 11 wherein the thickness of individual segments of said pattern of particles have thicknesses of at least five diameters of particles.

13. The process of claim 6 wherein particles passing through said holes in said mask form patterns of particles of at least three particle diameters in thickness.

14. The process of claim 13 wherein the thickness of individual segments of said pattern of particles have thicknesses of at least five diameters of particles.

15. The process of claim 1 wherein said particles have an average diameter of between 5 micrometers and 5 millimeters.

16. The process of claim 1 wherein said particles have an electrical resistivity of less than $10^{+10}$ ohm-centimeters.

17. The process of claim 13 wherein said particles have an average diameter of between 5 micrometers and 5 millimeters and said particles have an electrical resistivity of less than $10^{+10}$ ohm-centimeters.

18. A process for applying a discontinuous coating of particulates to a surface comprising the steps of:

a) providing a support, b) placing a bed of non-adhered particles on said support, said particles being capable of being moved by an electric field of less than 100 KV/cm, c) placing a mask with a first and second surface over said bed of non-adhered particles, said mask having holes which pass from said first to said second surface, said first surface facing said bed of non-adhered particles without said mask touching said bed of non-adhered particles, said holes in said mask having a size which would allow passage of individual particles from said bed of non-adhered particles through said holes, d) placing a receptor material capable of at least temporarily retaining an electric charge adjacent said second surface of said mask, which second surface faces away from said bed of non-adhered particles, e) applying an electrical charge to said receptor material which is at least temporarily retained by said receptor material, f) applying an electrical field between said mask and said support, said electrical field being of at least sufficient strength to cause individual particles from said bed of non-adhered particles to move off said support and impact said mask, g) allowing some of said individual particles which move off said support to enter said holes in said mask and contact said receptor material, and h) said contact by individual particles to said receptor material causing at least some of said particles contacting said receptor material to adhere to said receptor material at least by charge attraction of said individual particles to charge on said receptor material, wherein a conductive element is placed against a side of said receptor material which faces away from said first substrate after step h.

19. The process of claim 18 wherein after said conductive material is placed against said receptor material, said receptor material is pulled away from said mask and said receptor material carries with it a discontinuous pattern of particles adhered to said receptor material.

20. The process of claim 19 wherein particles passing through said holes in said mask form patterns of particles of at least three particle diameters in thickness.

21. The process of claim 20 wherein the thickness of individual segments of said pattern of particles have thicknesses of at least five diameters of particles.

22. A process for applying a discontinuous coating of particulates to a surface comprising the steps of:

a) providing a support, b) placing a bed of non-adhered particles on said support said particles being capable of being moved by an electric field of less than 100 KV/cm.

c) placing a mask with a first and second surface over said bed of non-adhered particles, said mask having holes which pass from said first to said second surface, said first surface facing said bed of non-adhered particles without said mask touching said bed of non-adhered particles, said holes in said mask having a size which would allow passage of individual particles from said bed of non-adhered particles through said holes, d) placing a receptor material capable of at least temporarily retaining an electric charge adjacent said second surface of said mask, which second surface faces away from said bed of non-adhered particles, e) applying an electrical charge to said receptor material which is at least temporarily retained by said receptor material, f) applying an electrical field between said mask and said support, said electrical field being of at least sufficient strength to cause individual particles from said bed of non-adhered particles to move off said support and impact said mask, g) allowing some of said individual particles which move off said support to enter said holes in said mask and contact said receptor material, and h) said contact by individual particles to said receptor material causing at least some of said particles contacting said receptor material to adhere to said receptor material at least by charge attraction of said individual particles to charge on said receptor material, wherein said receptor material comprises organic polymeric film.

23. A process for applying a discontinuous coating of particulates to a surface comprising the step of:

a) providing a support, b) placing a bed of non-adhered particles on said support, said particles being capable of being moved by an electric field of less than 100 KV/cm.

c) placing a mask with a first and second surface over said bed of non-adhered particles, said mask having holes which pass from said first to said second surface, said first surface facing said bed of non-adhered particles without said mask touching said bed of non-adhered particles, said holes in said mask having a size which would allow passage of individual particles from said bed of non-adhered particles through said holes, d) placing a receptor material capable of at least temporarily retaining an electric charge adjacent said second surface of said mask, which second surface faces away from said bed of non-adhered particles, e) applying an electrical charge to said receptor material which is at least temporarily retained by said receptor material, f) applying an electrical field between said mask and said support, said electrical field being of at least sufficient strength to cause individual particles from said bed of non-adhered particles to move off said support and impact said mask, g) allowing some of said individual particles which move off said support to enter said holes in said mask and contact said receptor material, and h) said contact by individual particles to said receptor material causing at least some of said particles contacting said receptor material to adhere to said receptor material at least by charge attraction of said individual particles to charge on said receptor material, wherein said receptor material comprises organic polymeric film, wherein said electrical field applied in step f) causes particles with an electrical charge opposite that of the charge provided on said receptor material to move towards said receptor material, and causes particles with an electrical charge similar to that provided on said receptor material to move away from said receptor material, wherein the movement of particles towards and away from said receptor material produces a cloud of moving particles between said support and said mask, wherein the thickness of individual segments of said pattern of particles have thicknesses of at least five diameters of particles, and wherein said particles have an average diameter of between 5 micrometers and 5 millimeters and said particles have an electrical resistivity of less than $10^{+10}$ ohm-centimeters.

24. The process of claim 23 wherein said particles are selected from the group consisting of metals, metal alloys, glass, ceramics, inorganic compounds, and organic materials.

25. A process for applying a discontinuous coating of particulates to a surface comprising the steps of:

a) providing a support, b) placing a bed of non-adhered particles on said support, said particles being capable of being moved by an electric field of less than 100 KV/cm, c) placing a mask with a first and second surface over said bed of non-adhered particles, said mask having holes which pass from said first to said second surface, said first surface facing said bed of non-adhered particles without said mask touching said bed of non-adhered particles, said holes in said mask having a size which would allow passage of individual particles from said bed of non-adhered particles through said holes, d) placing a receptor material capable of at least temporarily retaining an electric charge in contact with said second surface of said mask, which second surface faces away from said bed of non-adhered particles, e) applying an electrical charge to said receptor material which is at least temporarily retained by said receptor material, f) applying an electrical field between said mask and said support, said electrical field being of at least sufficient strength to cause individual particles from said bed of non-adhered particles to move off said support and impact said mask, g) allowing some of said individual particles which move off said support to enter said holes in said mask and contact said receptor material, and h) said contact by individual particles to said receptor material causing at least some of said particles contacting said receptor material to adhere to said receptor material at least by charge attraction of said individual particles to charge on said receptor material wherein said particles comprise a core of material having a conductivity and a shell of greater conductivity than the conductivity of said core.

26. The process of claim 25 wherein said mask is in contact with said receptor material when step f) is performed.

27. A process for applying a discontinuous coating of multiple layers of particles to a surface comprising the steps of:

a) providing a support, b) placing a bed of non-adhered particles on said support, said particles being capable of being moved by an electric field of less than 100 KV/cm, c) placing a mask with a first and second surface with holes in the mask over said bed of non-adhered particles, said first surface facing said bed of non-adhered particles without said mask touching said bed of non-adhered particles, said holes in said mask having a size which would allow passage of individual particles from said bed of non-adhered particles through said holes, d) placing a receptor material capable of at least temporarily retaining an electric charge in contact with said second surface of said mask, which second surface faces away from said bed of non-adhered particles, e) applying an electrical charge to said receptor material which is at least temporarily retained by said receptor material, f) applying an electrical field between said mask and said support, said electrical field being of at least sufficient strength to cause individual particles from said bed of non-adhered particles to move off said support and impact said mask, g) allowing some of said individual particles which move off said support to enter said holes in said mask and contact said receptor material, and h) said contact by individual particles to said receptor material causing at least some of said particles contacting said receptor material to adhere to said receptor material only by charge attraction of said individual particles to charge on said receptor material.

28. A process for applying a discontinuous coating of particles to a surface comprising the steps of:

a) providing a support, b) placing a bed of non-adhered particles on said support, said particles being capable of being moved by an electric field of less than 100 KV/cm, c) placing a mask with a first and second surface with holes in the mask over said bed of non-adhered particles, said first surface facing said bed of non-adhered particles without said mask touching said bed of non-adhered particles, said holes in said mask having a size which would allow passage of individual particles from said bed of non-adhered particles through said holes, d) placing a receptor material capable of at least temporarily retaining an electric charge in contact with said second surface of said mask, which second surface faces away from said bed of non-adhered particles, e) applying an electrical charge to said receptor material which is at least temporarily retained by said receptor material, f) applying an electrical field between said mask and said support, said electrical field being of at least sufficient strength to cause individual particles from said bed of non-adhered particles to move off said support and impact said mask, g) allowing some of said individual particles which move off said support to enter said holes in said mask and contact said receptor material, and h) said contact by individual particles to said receptor material causing at least some of said particles contacting said receptor material to adhere to said receptor material at least by charge attraction of said individual particles to charge on said receptor material.

* * * * *